(12) United States Patent
Lin (10) Patent No.: US 9,693,043 B2
(45) Date of Patent: Jun. 27, 2017

(54) LENTICULAR PRINT THREE DIMENSIONAL IMAGE DISPLAY DEVICE AND METHOD OF FABRICING THE SAME

(75) Inventor: Anshyang Albert Lin, Raritan, NJ (US)

(73) Assignee: Actega North America, Inc., Delran, NJ (US)

( * ) Notice: Subject to any disclaimer, the term of this patent is extended or adjusted under 35 U.S.C. 154(b) by 529 days.

(21) Appl. No.: 14/648,346

(22) PCT Filed: Jul. 27, 2012

(86) PCT No.: PCT/US2012/048595
§ 371 (c)(1),
(2), (4) Date: May 29, 2015

(87) PCT Pub. No.: WO2013/048615
PCT Pub. Date: Apr. 4, 2013

(65) Prior Publication Data
US 2015/0304639 A1 Oct. 22, 2015

Related U.S. Application Data

(60) Provisional application No. 61/541,619, filed on Sep. 30, 2011.

(51) Int. Cl.
*G02B 27/22* (2006.01)
*H04N 13/04* (2006.01)
(Continued)

(52) U.S. Cl.
CPC ... *H04N 13/0404* (2013.01); *B29D 11/00365* (2013.01); *B41F 17/00* (2013.01); *B41M 3/003* (2013.01); *G02B 27/2214* (2013.01); *G03F 7/0037* (2013.01); *G03F 7/027* (2013.01); *G03F 7/038* (2013.01); *G03F 7/0388* (2013.01); *G03F 7/0757* (2013.01); *G03F 7/165* (2013.01); *G09F 19/14* (2013.01); *G02B 3/005* (2013.01); *H04N 2213/001* (2013.01)

(58) Field of Classification Search
CPC ........ B29D 11/00365; B29D 11/00278; G02B 3/005; G02B 3/0012; G09F 19/14
See application file for complete search history.

(56) References Cited

U.S. PATENT DOCUMENTS 5,762,379 A 6/1998 Salmon et al.
6,113,149 A 9/2000 Dukatz
(Continued)

FOREIGN PATENT DOCUMENTS

WO WO 2005/002696 A1 3/2005

*Primary Examiner* — Betelhem Shewareged
(74) *Attorney, Agent, or Firm* — Ladas & Parry LLP (57) ABSTRACT

The invention provides a lenticular lens type three-dimensional image display device and a method of fabricating the device without a need for a clear plastic substrate transposed between the image and lenticular lenses. The device can be obtained by directly printing curable coatings onto the image, making them particularly well suited for volume production. The combination the image printing and application of curable coatings process can be joined together to conduct the single pass-process. The single pass-process allows for flexibility of the printing only selective areas of the substrate. Moreover, this process allows the device to be recyclable.

25 Claims, 3 Drawing Sheets

(51) Int. Cl.
*B29D 11/00* (2006.01)
*G09F 19/14* (2006.01)
*B41M 3/00* (2006.01)
*G03F 7/00* (2006.01)
*G03F 7/027* (2006.01)
*G03F 7/038* (2006.01)
*G03F 7/075* (2006.01)
*G03F 7/16* (2006.01)
*B41F 17/00* (2006.01)
*G02B 3/00* (2006.01)

(56) References Cited

U.S. PATENT DOCUMENTS

| | | |
|---|---|---|
| 6,170,881 B1 | 1/2001 | Salmon et al. |
| 6,628,460 B1 | 9/2003 | Ookawa et al. |
| 6,833,960 B1 | 12/2004 | Scarbrough et al. |
| 6,856,462 B1 | 2/2005 | Scarbrough et al. |
| 7,290,803 B2 | 11/2007 | Scarbrough et al. |
| 7,514,140 B2 | 4/2009 | Tsukuda |
| 7,609,451 B1 | 10/2009 | Scarbrough |
| 7,639,426 B2 | 12/2009 | Blondal et al. |
| 2006/0230928 A1 | 10/2006 | Seaton |
| 2006/0285215 A1* | 12/2006 | Wu ............... G02B 3/0012 359/619 |
| 2009/0147367 A1* | 6/2009 | Blondal ............ G02B 27/2214 359/619 |
| 2010/0154015 A1 | 6/2010 | Kang et al. |
| 2010/0254015 A1* | 10/2010 | Booyens ............ B42D 25/382 359/619 |
| 2011/0051396 A1 | 3/2011 | Liao et al. |

\* cited by examiner

Figure 4. Lenticular Effect of the Entire Sheet

Figure 5. Spot Lenticular Areas and Various Lenticular Designs and Directions

LENTICULAR PRINT THREE DIMENSIONAL IMAGE DISPLAY DEVICE AND METHOD OF FABRICING THE SAME

CROSS-REFERENCE TO RELATED APPLICATION

This application claims priority to U.S. Patent Application Ser. No. 61/541,619 filed Sep. 30, 2011, the contents of which are incorporated herein by reference.

FIELD OF THE INVENTION

The present invention relates to a lenticular print three dimensional image display device, and a method of fabricating the device. The device can be obtained by directly printing ultraviolet curable coatings onto the image, making them particularly well suited for volume production.

BACKGROUND OF THE INVENTION

Lenticular print image display device is specially prepared graphics that are designed to work with a lenticular lens that allows the viewer to see different images depending on the angle at which it is viewed.

To impart a three dimensional effect, images are printed in an interlaced format. A lens sheet is place on top of the image that serves as a decoder for the image that is printed behind it. The lens sheet is a transparent plastic sheet that contains one side with lenticular lenses with a specific height, which have been extruded, cast, or embossed with an array of identical parallel lenses or a plurality of semispherical convex lenses arranged in a specific pattern. Conventional extrusion process generally provides a lens material thickness of about 10 mils (250 microns) to 40 mils (1000 microns) due to the extrusion process limitation. Also thicker lens materials minimize film distortion in lenticular print image devices. The other side of the lens sheet remains smooth. Images can be printed directly on this smooth side of the lens sheet (known as Direct-to-lens Process) or can be affixed onto the aforementioned side of the lens sheet.

Precise alignment of the image and lens sheet is paramount to achieve the desired three dimensional effects in a lenticular print. The image itself is a composite of two or more graphics that are interlaced together. Each individual lenticular lens must be perfectly aligned with the interlaced image underneath it in order for the effect to work. Based on the angle of the viewer, each lenticular lens acts as a magnifying glass to enlarge and display the portion of the image below. The lenticular lens receives light that passes from the direction of the flat surface toward the ridges and directs such light in a way that sends different portions of the light entering each lenticular lens to different portions of a viewing area in front of the lenticular lens. Plurality of lenticular lenses work in harmony to form the entire lenticular image. Thus, lenticular print can appear to show motion or even give off three-dimensional effect because each eye is viewing the lenticular print from its own angle.

The lenticular print image display device requires a transparent plastic lens sheet with a specific height. The lenticular lenses are formed atop of the transparent plastic lens to form the device.

In U.S. Pat. No. 7,514,140 to Tsukuda, issued Apr. 7, 2009, entitled "Acrylic Film for Lens Substrate, Lens Film Using the Same Lens Sheet," describes a lens substrate which requires an acrylic film. The film has a specific thickness, and a lens layer is created on top of the film to suppress any warping or sagging deformations.

In U.S. Pat. No. 7,639,426, issued Dec. 29, 2009, entitled "Micro-lens Enhanced Element," describes methods and apparatuses forming micro-lens enhanced images. The micro-lens apparatus also require a transparent layer with a specific thickness that separates an image from lenticular lens.

U.S. Pat. No. 6,628,460, issued Sep. 30, 2003, entitled "Lens Sheet and Method for Producing the Same," provides a lens sheet comprising a transparent substrate and a lens portion, with a relaxation layer between the transparent substrate and the lens portion. It is disclosed that the relaxation layer is 1-30% of the height of the lens unit.

US Pat. Publication No. 2006/0285215, published Dec. 21, 2006, entitled "Printing Method for Making a Lenticular Lens Material," provides a direct-to lens method for creating a lens material using energy curable inks and coatings. An image is printed on the back sheet of a transparent substrate sheet and the energy-curable ink is printed on the back sheet of the transparent substrate.

The above described lenticular print three dimensional image display lenses require a transparent sheet transposed between the lenticular lenses and the image with a specific thickness of the transparent sheet. The use of such technique typically requires the display to be co-extensive with the entire area of the image. However, cost, weight and other factors often cause a publisher to wish to avoid publishing entire pages of documents in lenticular form. Thus, for example, it may be useful to provide a three-dimensional image as a part of a sheet or page of a book, it is much less desirable to do so where such an image will occupy an entire page. Also, precision alignment and tight registration of the interlaced images with the lenticular lenses makes forming the lenticular device difficult. Corrections of the distortion of the lens due to misalignment require special printing techniques, custom equipment and set-up.

Thus, there remains a need for a simple, flexible and efficient method to create useful lenticular lens type three dimensional image displays. There is a further need for arrangement of lenticular lens that can be used with co-designed printed images to provide enhanced articles that provide particular visual effects and that can be formed in a reliable fashion using generally available commercial resources. The current invention fulfills this need.

BRIEF SUMMARY OF THE INVENTION

The invention provides a lenticular lens type three-dimensional image display device and a method of fabricating the device.

In one aspect, the lenticular print three dimensional image display device comprises: (A) a substrate with a proximate surface and a distal surface wherein an image is printed on a proximate surface; (B) a first curable coating composition that is applied on top of the printed image in a first pre-determined pattern; and (C) a second curable coating composition that is applied on top of the printed image, wherein the second curable coating composition self-registers into a second pattern that does not overlap with the first pre-determined pattern. The first curable coating composition comprises (i) at least one acrylate monomer, (ii) an acrylate oligomer with a backbone that comprises one or more groups selected from epoxy, polyester, urethane, acrylic and silicone, (iii) a photoinitiator, and (iv) a siloxane or silicone additive with a weight average molecular weight (Mw) less than 100,000 Daltons. The second curable coating composition comprises (i) at least one acrylate monomer, (ii) an acrylate oligomer with a backbone that comprises one or more groups selected from epoxy, polyester, urethane, acrylic and silicone, (iii) a photoinitiator, and (iv) a self-assembling additive that prevents flow and promotes self-retracting. Both curable coating compositions are printed directly on the proximate surface, on top of the interlaced image, of the substrate and in registration of interlaced image design. The self-assembling additive with a weight average molecular weight (Mw) greater than 200,000 Daltons. The addition of the self-assembling additive creates a selective surface pattern of the second coating. The second curable coating composition retracts away from the first coating similar to Bènard convection. The peak height of the cured second coating is at least two-times the peak height of the cured first coating.

Yet another aspect of the invention is directed to a method of fabricating a print three dimensional image display device comprising (1) printing an image on the proximate surface of a substrate, (2) applying a first curable coating composition on top of the interlaced image in a first pre-determined pattern, (3) curing the first curable coating composition, (4) applying a second curable coating composition on top of the interlaced image, wherein the second curable coating composition self registers into a second pattern that does not overlap with the first pre-determined pattern, and (5) curing the second curable coating composition; wherein the first curable coating composition comprises a siloxane or silicone additive with a weight average molecular weight (Mw) less than 100,000 Daltons and wherein the second curable coating composition comprises a self-assembling additive with a weight average molecular weight (Mw) greater than 200,000 Daltons. The interaction of the two curable coating compositions results in a lens alignment that is in registration with the interlaced image to realize the desirable effect.

In another aspect of the invention is directed to a method of fabricating a print three dimensional image display device comprising (1) printing an image on the proximate surface of a substrate, (2) applying a first curable coating composition on top of the interlaced image in a first pre-determined pattern, (3) applying a second curable coating composition on top of the interlaced image in a second pre-determined pattern, wherein the second pre-determined pattern does not overlap with the first pre-determined pattern, and (4) curing both the first and second curable coating compositions, wherein the first curable coating composition comprises a siloxane or silicone additive with a weight average molecular weight (Mw) less than 100,000 Daltons and wherein the second curable coating composition comprises a self-assembling additive with a weight average molecular weight (Mw) greater than 200,000 Daltons. The curable coating compositions are applied in a pre-determined pattern that is in registration with the interlaced image to realize the desirable effect.

DETAILED DESCRIPTION OF THE INVENTION

All references cited are incorporated herein.

The lenticular print three dimensional image display device comprises (A) an interlaced image printed on a substrate; (B) a first curable coating composition; and (C) a second curable coating composition. The curable coating compositions are applied directly onto the interlaced image, forming lenticular lenses. The device does not require a transparent sheet to be transposed between the lenticular lenses and the image.

Both curable coating compositions are optically transparent curable compositions. The first curable coating composition comprises (i) at least one acrylate monomer, (ii) an acrylate terminated oligomer, with a backbone of an epoxy, polyester, urethane, acrylic, silicone and mixtures thereof, (iii) a photoinitiator, and (iv) a siloxane or silicone additive with a weight average molecular weight (Mw) less than 100,000 Daltons. The second curable coating composite comprises (i) at least one acrylate monomer, (ii) an acrylate terminated oligomer, with a backbone of an epoxy, polyester, urethane, acrylic, silicone and mixtures thereof, (iii) a photoinitiator, and (iv) a self-assembling additive that has a weight average molecular weight (Mw) greater than 200,000 Daltons.

The curable coating compositions require at least one acrylate monomer. Acrylate monomers useful for the curable coating compositions include mono-functional, di-functional, tri-functional and multi-functional acrylate monomers. Exemplary mono-functional acrylate monomers include, but not limited to, octyl acrylate, decyl acrylate, 2-phenoxyethyl acrylate, isobornyl acrylate, 2(2-ethoxyethoxy)ethyl acrylate, ethoxylated nonylphenol acrylate, and the like. Exemplary di-functional acrylate monomers include, but not limited to, tripropylene glycol diacrylate, 1,6 hexanediol diacrylate, dipropylene glycol diacrylate, neopentyl glycol diacrylate, polyethylene glycol-200-diacrylate, polyethylene glycol-400-diacrylate, polyethylene glycol-600-diacrylate, triethylene glycol diacrylate, 3-ethoxylated bisphenol-A diacrylate, 4-ethoxylated bisphenol A diacrylate, 10-ethoxylated bisphenol-A diacrylate, 1,4-butanediol diacrylate, and the like. Exemplary tri-functional acrylate monomers include, but not limited to, trimethyol propane triacrylate, ethoxylated trimethyol propane triacrylate, 6-ethoxylated trimethyol propane triacrylate, 9-ethoxylated trimethyol propane triacrylate, 15-ethoxylated trimethyol propane triacrylate, 20-ethoxylated trimethyol propane triacrylate, propoxylated glyceryl triacrylate, and the like. Exemplary multi-functional acrylate monomers include, but not limited to, pentaerythritol tetraacrylate, di-trimethylol propane tetraacrylate, di-pentaerythritol pentaacrylate, and the like.

Preferred acrylate monomers for both the first and the second curable coating compositions include isobornyl acrylate, 2(2-ethoxyethoxy)ethyl acrylate, tripropylene glycol diacrylate; 1,6 hexanediol diacrylate; neopentyl glycol diacrylate; trimethyol propane triacrylate; 6-ethoxylated trimethyol propane triacrylate, 9-ethoxylated trimethyol propane triacrylate, 15-ethoxylated trimethyol propane triacrylate, 20-ethoxylated trimethyol propane triacrylate, and propoxylated glyceryl triacrylate.

The curable coating compositions further comprise an acrylate oligomer that has backbones of epoxy, polyester, urethane, acrylic, silicone or mixtures thereof. Preferably, this acrylate oligomer component is an acrylate terminated oligomer with film-forming properties. For example, and without limitation, the oligomer of this embodiment can be an acrylate oligomer such as a polyester acrylate oligomer with a plurality of acrylate sequences per oligomer molecule. In some embodiments, the acrylate oligomer can have two to six acrylate sequences per oligomer molecule.

Examples of epoxy acrylate oligomers include, but are not limited to, bisphenol-A epoxy diacrylate (Ebecryl 3700, Ebecryl 3720 from Cytec; CN120, CN104 from Sartomer), modified bisphenol-A epoxy diacrylate (Ebecryl 3701 from Cytec), epoxy acrylate (CN121, CNUVE151 from Sartomer), and the like. Examples of acrylic acrylate oligomers include, but not limited to, CN2285 and CN549 from Sartomer. Typically, epoxy acrylate oligomers are available in a mixture with an acrylate monomer, wherein the oligomer is the major (typically greater than 50 weight percent) component of the mixture. Examples of polyester acrylate oligomers include, but are not limited to, CN292, CN293, CN704, CN2200 and CN2262 from Sartomer and Ebecryl 871 from Cytec; polyester tera-acrylate (Ebecryl 657 from Cytec), fatty acid modified polyester hexa-acrylate (Ebecryl 870), polyester tetra-acrylate (Ebecryl 810 from Cytec), and the like. Examples of urethane acrylate oligomers include, but are not limited to, aromatic urethane acrylate (Ebecryl 4827 from Cytec), aromatic urethane hexa-acrylate (Ebecryl 220), aliphatic urethane diacrylate (Ebecryl 230, Ebecryl 284, Ebecryl 4883, Ebecryl 8210 from Cytec; CN9009, CN9024, CN966, from Sartomer) and the like.

Preferred acrylate oligomer components include bisphenol-A epoxy diacrylate, and various monomer dilutions thereof. Also preferred are polyester tera-acrylate, fatty acid modified polyester hexa-acrylate, polyester acrylates; aromatic urethane acrylate, aliphatic urethane diacrylate, acrylic acrylate oligomer, and various monomer dilutions thereof.

The curable coating composition further comprises a photoinitiator. Examples of photoinitiator include, but not limited to, benzophenone, 4-methyl benzophenone, liquid benzophenone (Photomer 81 from Cognis), 4-phenylbenzyophenone, methyl-2-benzoylbenzoate, 2-hydroxy-2-methyl-1-phenyl-1-propanone, 1-hydroxy-cyclohexyl-phenyl-ketone, oxy-phenyl-acetic acid 2-[2-oxo-2-phenyl-acetoxy-ethoxy]-ethyl ester, oxy-phenyl-acetic acid 2-[2-hydroxy-ethoxy]-ethyl ester, benzyldimethyl ketal, 2-hydroxy-1[4-(2-hydroxyethoxy)phenyl]-2-methyl-1-propanone, diphenyl(2,4,6-trimethylbenzoyl)-phosphine oxide, ethyl-2,4,6-trimethylbenzoylphenylphosphinate, phenyl bis (2,4,6-trimethyl benzoyl)phosphine oxide, blends of acyl phosphine oxide, alpha hydroxy ketone, phenyl-bis(2,4,6-trimethylbenzoyl)-phosphine oxide (Irgacure 2022, Irgacure 819, Irgacure 2100 from CIBA), difunctional-alpha-hydroxy ketone (Esacure one from Lamberti), oligo[2-hydroxy-2-methyl-1-[4-(1-methylvinyl)phenyl]propanone] (Esacure KIP150 from Lamberti), 1-propanone, 1-[4-[(4-benzoylphenyl)thio]phenyl]-2-methyl-2-[(4-methylphenyl)sulfonyl] (Esacure 1001 from Lamberti), poly{1-[4-(phenylcarbonyl)-4'-(methyldiphenylsulphide)]ethylene} (Speedcure 7003 from Lambson), poly{1-[4-(phenylcarbonyl)phenyl]ethylene}(Speedcure 7006 from Lambson), 1,3-di({a-[1-chloro-9-oxo-9H-thioxanthen-4-yl)oxy]acetylpoly[oxy(1-methylethylene)]}oxy)-2,2-bis({a-[1-chloro-9-oxo-9H-thioxanthen-4-yl)oxy]acetylpoly[oxy(1-methylethylene)]}oxymethyl) propane (Speedcure 7010 from Lambson), poly{1-[4-(phenylcarbonyl)-4'-(chlorophenyl)]ethylene} (Speedcure 7020 from Lambson), 1,3-di({alpha-2-(phenylcarbonyl)benzoylpoly[oxy(1-methylethylene)]}oxy)-2,2-bis ({alpha-2-phenylcarbonyl)-benzoylpoly[oxy(1-methylethylene)]}oxymethyl) propane; {alpha-2-(phenylcarbonyl) benzoylpoly(oxyethylene)-poly[oxy(1-methylethylene)]-poly(oxyethylene)}2-(phenylcarbonyl)benzoate; and mixtures thereof.

The above photoinitiator are commercially available as neat or in a mixture, such as, Irgacure 754 from CIBA (mixture of oxy-phenyl-acetic acid and 2-[2-oxo-2-phenyl-acetoxy-ethoxy]-ethyl ester and oxy-phenyl-acetic acid 2-[2-hydroxy-ethoxy]-ethyl ester); Darocur 4265 from BASF (blend of acyl phosphine oxide/alpha hydroxy ketone photoinitiator); and Speedcure 7005 (mixture of -1,3-di ({alpha-2-(phenylcarbonyl)benzoylpoly[oxy(1-methylethylene)]}oxy)-2,2-bis({alpha-2-phenylcarbonyl)-benzoyl-poly[oxy(1-methylethylene)]}oxymethyl) propane and {alpha-2-(phenylcarbonyl)benzoylpoly(oxyethylene)-poly [oxy(1-methylethylene)]-poly(oxyethylene)}2-(phenylcarbonyl)benzoate).

Preferred photoinitiators include benzophenone, methyl-2-benzoylbenzoate, 2-hydroxy-2-methyl-1-phenyl-1-propanone, 1-hydroxy-cyclohexyl-phenyl-ketone, mixture of oxy-phenyl-acetic acid 2-[2-oxo-2-phenyl-acetoxy-ethoxy]-ethyl ester and oxy-phenyl-acetic acid 2-[2-hydroxy-ethoxy]-ethyl ester, ethyl-2,4,6-trimethylbenzoyl-phenyl phosphinate, diphenyl(2,4,6-trimethylbenzoyl)-phosphine oxide and mixtures thereof. Depending on the thickness of the film, a mixture of photoinitiators may be used to fully cure the film.

The first curable coating composition further comprises a siloxane or silicone additive that has a weight average molecular weight (Mw) less than 100,000 Daltons. In another embodiment, the siloxane or silicone additive has a weight average molecular weight (Mw) less than 75,000 Daltons. The siloxane or silicone additive also has surface tension lowering properties. The addition of the siloxane or silicone additive lowers the overall surface tension of the cured first curable coating composition to less than 32 dynes/cm$^2$ as measured by ASTM D7490-08. Preferred siloxane or silicone additives include, but not limited to, polydimethylsiloxanes, dimethicones, organo modified polysiloxanes, cyclopentasiloxanes, silicone oils such as methyl silicone oil and dimethyl silicone oil, organofunctional silanes, and the like, and blends or mixtures thereof. The siloxane or silicone additives can also include copolymers or graft polymers, such as silicone acrylate, silicone polyether acrylate, polyether siloxane copolymer, polysiloxane polyether copolymer. The preferred siloxane or silicone have viscosities that range from about 100-2500 mPa·sec at 77° C.

The siloxane or silicone additive for the first curable coating compositions include radically crosslinkable silicone acrylate, acrylated polysiloxanes and acrylated polyorganosiloxane. A more preferred siloxane or silicone additive includes those that exhibit release coating characteristics after curing, especially with peel force less than 30 g/inch.

Examples of siloxanes and silicone additive for the first curable coating composition include radically cross-linkable silicone polyether acrylate (TEGO Rad 2100, TEGO Rad 2250 from Evonik), radically crosslinkable silicone acrylate (TEGO Rad 2500, TEGO 2650 TEGO Rad 2700 from Evonik), polyether siloxane copolymer (TEGO Glide 410 from Evonik), acrylated polysiloxanes (TEGO RC922, RC902, RC711 from Evonik), organo modified silicone polymer (CoatOSil 3573 from Momentive Performance Materials), polyalkyleneoxide modified polydimethylsiloxane (Silwet L-7602 from Momentive Performance Materials), polydimethylsiloxanes (SF-96 from Momentive Performance Materials, available with viscosities of 5, 10, 20, 50, 100, 200, 350, 500 and 1000 centistokes), nonreactive silicone glycol copolymer surfactant (Dow Corning 57 Additive from Dow Corning); and polyether modified polydimethylsiloxane (BYK-UV 3510 from BYK Chemie), acrylated polyorganosiloxanes (Sicolease PC900, Sicolease PC970 from Blue Star Silicones) and mixtures thereof.

The second curable composition repels from the first curable and/or cured compositions, and thereby, the second curable composition self-assembles into a desired pattern.

The self-assembly additives for the second curable coatings are methyl polysiloxanes with relative weight average molecular weight (Mw) greater than 200,000 Daltons, as determined by Gel Permeation Chromatography (GPC) using polystyrene as molecular weight standards. In another embodiment, the self-assembly additive has a weight average molecular weight (Mw) greater than 300,000 Daltons. Exemplary self-assembly additives for the second curable coating composition include, but not limited to, solution of polydimethylsiloxane (TEGO Hammer 501 from Evonik and TEGO Hammer 300000 from Evonik) and methyl polysiloxane (Baysilone-Paint Additive 3451 in 20% in xylene from OMG Group and 6-540 additive from Selemix System from PPG group).

Figure 2:
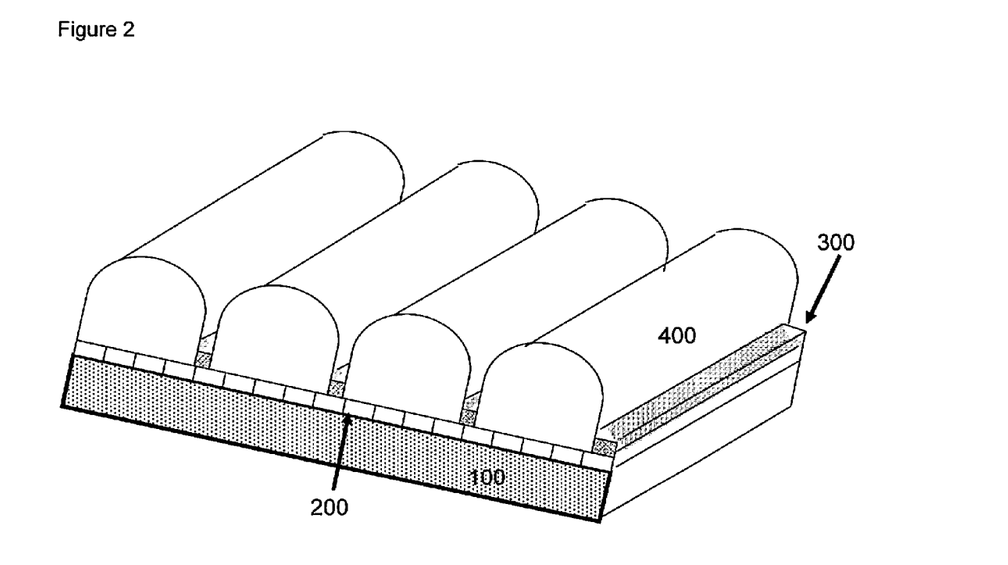
FIG. 2 is a top view of the lenticular print three dimensional image display device with parallel lenticular lenses.
Figure 3:
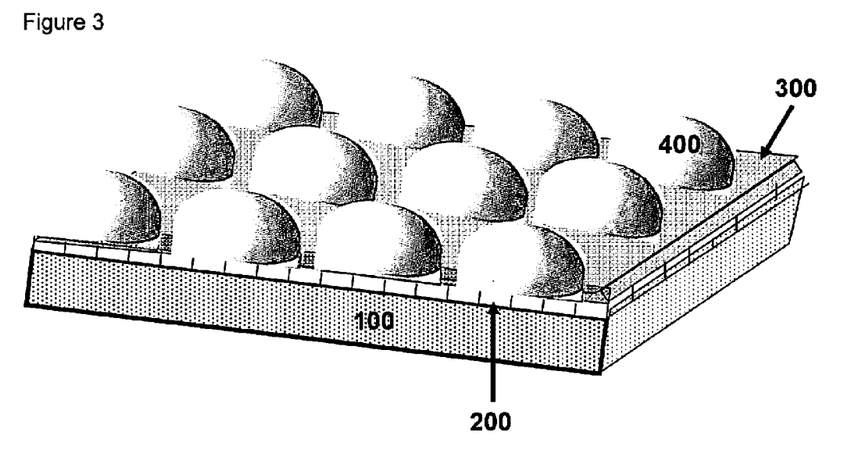
FIG. 3 is a top view of the lenticular print three dimensional image display device with silo-shaped lenticular lenses.

The repelling interaction allows the second coating to retract from the first coating and builds a height (400) that is at least two times higher than the first coating, as shown in FIGS. 2 and 3. The peak height of the cured second coating is at least two-times higher, preferably three-times higher, more preferably four-times higher than the peak height of the cured first coating.

Surprisingly, the addition of the self-assembly additives in the second curable coatings increases the speed of the lens formation. The lens formation of the second curable composition is visible almost instantaneously upon applying the second curable coating composition next to the first curable or cured coating composition.

The curable coating compositions optionally comprise a cure accelerator, which can be in the form of non-crosslinkable tertiary amine or crosslinkable tertiary amine. Examples of non-crosslinkable amine cure accelerators include, but not limited to, methyl diethanolamine, triethanolamine, n-butyldiethanolamine, ethyl-4-(dimethylamino) benzoate, 2-ethylhexyl-4-(dimethylamino)benzoate, 2-(dimethylamino)ethylbenzoate, poly[oxy(methyl-1,2-ethyanediyl)], alpha-[4-(dimethylamino)benzoyl-butoxy, poly[oxy(methyl 1,2-ethanediyl)], alpha-[4-(dimethylamino)benzoyl-alpha-butoxy (Speedcure PDA from Lambson), and butoxyethyl-4-(dimethylamino)benzoate. Examples of crosslinkable amine cure accelerator include, but not limited to Ebecryl P104 from Cytec, Ebecryl 83, Ebecryl P115, Ebecryl 7100 from Cytec; Etercure 7417, Etercure 6410, Etercure 6420 (from Eternal Chemicals Co.); Speedcure 7040, Omnirad Cl-250 from IGM Resin, 2-propenoic acid and 2-ethyl-2-(((1-oxo-2-propenyl)oxy) methyl)-1,3-propanediyl ester.

Preferred tertiary amines include diethanolamine, triethanolamine, 2-propenoic acid, 2-ethyl-2-(((1-oxo-2-propenyl) oxy)methyl)-1,3-propanediyl ester, ethyl-4-(dimethylamino) benzoate and mixtures thereof.

Optional additives such as antioxidants, stabilizers, antimisting agents, defoamers, flow additives, fillers, dyes, optical brighteners, can be added up to about 10 wt % of the curable coating composition.

The curable coating compositions are formed by combining the solid and liquid components together. Heat and mixing can be adjusted to form a uniform coating composition.

The viscosities of the coating compositions can be adjusted to suit a particular application method and to obtain a desired thickness or meniscus curvature of the coated materials (400). For instance, application of the first coating by means of lithographic printing requires high viscosity, e.g., more than about 2000 mPa·sec at 50° C. On the other hand, application by means of flexographic printing of the first coating composition requires lower viscosity, e.g., 150-3000 mPa·sec at 25° C. Application by means of ink jet printing of the first coating composition requires a viscosity less than 60 mPa·sec at the application temperature of the ink jet print head. One skilled in the art can adjust the viscosity of the first coating composition to suit various printing limitations.

The first coating is applied in registration (in a pre-determined pattern) with the interlaced image into a desirable thickness and the composition is then cured. The term, "curing" means drying, heating or curing by means of an energy source, such as, but not limited to, thermal cure, ultraviolet light (200-500 nm), electron beam, or light emitting diode or any other high energy light source. The preferred curing method is ultraviolet light curing. The cured height of the first coating composition ranges from about 0.05-0.3 mil thickness.

The viscosity of the second curable composition ranges from about 150 to about 10,000 mPa·sec at 25° C., preferably from about 200 to about 3,000 mPa·sec at 25° C. The viscosity of the second curable coating can be adjusted to suit various printing methods.

Another aspect is directed to the method of fabricating the lenticular print three dimensional image display device. The method comprises:
  (i) printing an interlaced image on the proximate surface of a substrate;
  (ii) applying a first curable coating composition on top of the interlaced image in a first pre-determined pattern;
  (iii) curing the first curable coating composition;
  (iv) applying a second curable coating composition on top of the interlaced image, wherein the second curable coating composition self-registers into a second pattern that does not overlap with the first pre-determined pattern; and
  (v) curing the second curable coating composition;
wherein the first curable coating composition comprises a siloxane or silicone additive with a weight average molecular weight (Mw) less than 100,000 Daltons and the second curable coating composition comprises a self-assembling additive with a weight average molecular weight (Mw) greater than 200,000 Daltons. The curable coating compositions are applied in a pre-determined pattern that is in registration with the interlaced image to realize the desired effect.

Yet another aspect is directed to the method of fabricating the lenticular print three dimensional image display device. The method comprises:
  (i) printing an interlaced image on the distal surface of a substrate, wherein the substrate is transparent;

(ii) applying a first curable coating composition onto the proximate surface of the substrate in a first pre-determined pattern;

(iii) curing the first curable coating composition;

(iv) applying a second curable coating composition onto the proximate surface of the substrate, wherein the second curable coating composition self-registers into a second pattern that does not overlap with the first pre-determined pattern; and (v) curing the second curable coating composition;

wherein the first curable coating composition comprises a siloxane or silicone additive with a weight average molecular weight (Mw) less than 100,000 Daltons and the second curable coating composition comprises a self-assembling additive with a weight average molecular weight (Mw) greater than 200,000 Daltons. The curable coating compositions are applied in a pre-determined pattern that is in registration with the interlaced image to realize the desirable effect.

In another aspect of the invention is directed to a method of fabricating a print three dimensional image display device. The method comprises:

(i) printing an image on the proximate surface of a substrate;

(ii) applying a first curable coating composition on top of the interlaced image in a first pre-determined pattern;

(iii) applying a second curable coating composition on top of the interlaced image in a second pre-determined pattern, wherein the second pre-determined pattern does not overlap with the first pre-determined pattern; and (iv) curing both the first and second curable coating compositions;

wherein the first curable coating composition comprises a siloxane or silicone additive with a weight average molecular weight (Mw) less than 100,000 Daltons and the second curable coating composition comprises a self-assembling additive with a weight average molecular weight (Mw) greater than 200,000 Daltons. The curable coating compositions are applied in a pre-determined pattern that is in registration with the interlaced image to realize the desirable effect.

Any printing techniques to print an interlaced image may be used including offset printing, gravure printing, ink jet printing, lithography printing, flexographic printing, silk-screen printing, air brushing and the like. Lithography and flexographic printing, in particular, are preferred due to its high resolution, high speed and ease of use.

To give off the effect of a three dimensional display, an interlaced image (200) is printed on a substrate. Exemplary substrates include paper and plastic sheets, including oriented polypropylene, polystyrene, polyvinylchloride, polycarbonate, polyethylene, polyethylene terephthalate and acrylic. Preferably for paper substrates, the paper is coated with clay or sealed with a primer to avoid excessive dive-in of the inks and coatings.

The lenticular lenses are fabricated directly on the printed images without a transparent lens sheet transposed between the image and the lenticular lenses. The transparent curable coating compositions are applied directly onto the image to form the lenticular lenses with sufficient thickness to realize the three-dimensional effect. They are formed in the shape of a parallel (corrugated) lines or a domes (silo) patterns (as described in U.S. Pat. No. 7,130,126 and U.S. Pat. No. 5,644,431), where the pattern is highly uniform.

Figure 1:
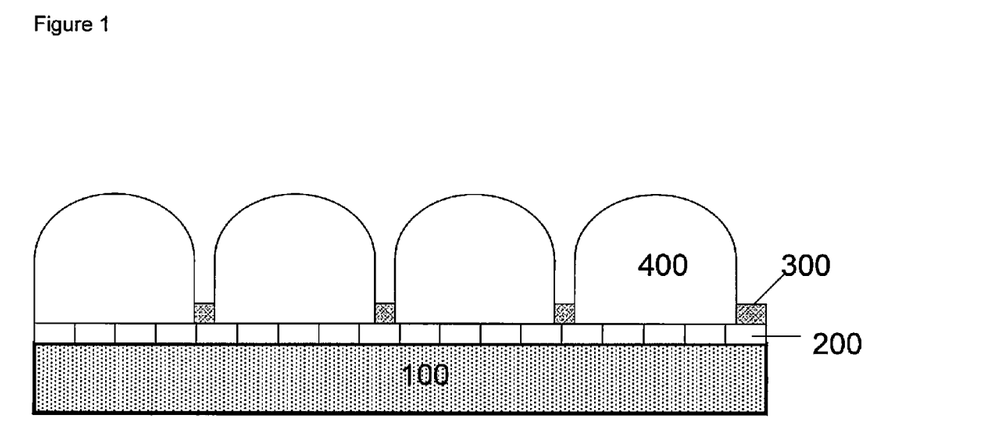
FIG. 1 is a lateral view of the lenticular print three dimensional image display device.

In one embodiment, the first curable coating (300 in Figures) is applied directly onto the printed interlaced image. The first coating can be applied in a controlled manner which develops into a pre-determined pattern that is in registration with the interlaced images. The pattern can range from relatively parallel lines (300 in FIGS. 1 and 2), or the area outside of semi-cylindrical dome or rectangular dome (300 in FIG. 3). The pattern and registration of the first curable coating to the images are applied through the registration mechanism of the printing/application device. The first curable coating develops a specific height on the image. The first coating composition is then cured into a cured first coating.

Optionally, air or heated air can be blown onto the device to aid in reducing the viscosity of the first curable coating composition.

The second coating (400 in Figures) is applied onto the image. The second curable coating composition self-registers into a second pattern that does not overlap with the first pre-determined pattern. In another embodiment, the second curable coating composition is applied on top of the interlaced image in a second pre-determined pattern, wherein the second pre-determined pattern does not overlap with the first pre-determined pattern.

Figure 4:
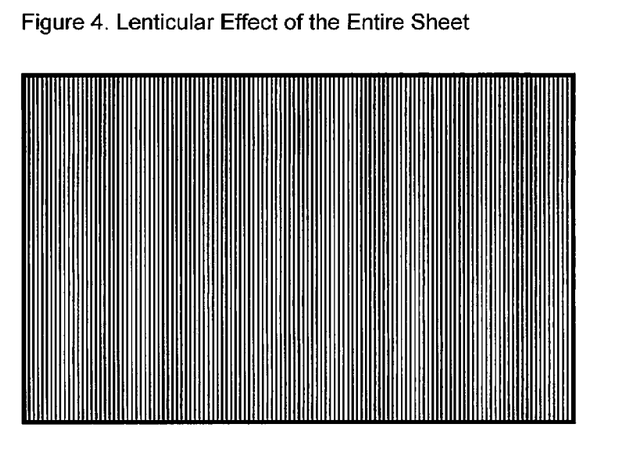
FIG. 4 is a top view of a lenticular print three dimensional device that is created on the entire sheet.
Figure 5:
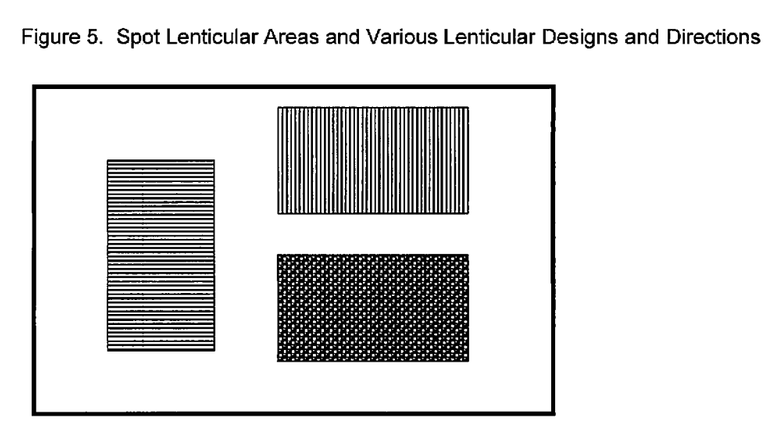
FIG. 5 is a top view of a spot lenticular print three dimensional device that contains various designs and directions.

The second curable coating may be applied as a flood coat (FIG. 4) to cover the entire sheet or spot-coated only in designated areas where the lenticular effect is desired (FIG. 5). Desirably, spot lenticular effect can be created in certain targeted areas of the substrate. The spot lenticular effect also allows for a mixture of various 3-D designs in a single sheet, and the direction of each design can also be varied (FIG. 5).

The self-assembling and self-registering properties of the second curable coating form the lenticular lenses. While not committing the theory, the addition of the self-assembling additive promotes the second curable coating composition to retract from the first coating composition due to the surface tension non-equilibrium of the two compositions, similar Bènard convection. It is believed that this repelling interaction allow the formation of convex meniscus of the second curable coating with a height that is at least two times greater than the cured first coating on the image. The coatings can be applied in various patterns, such as relative parallel lines in semi-cylindrical forms (FIG. 2, 400), semi-circular/silo shape (FIG. 3, 400) or rectangular domes.

Optionally, air or heated air can be blown onto the device, particularly to the proximate surface where the second coating has been applied onto, to aid in reducing the viscosity of the second curable coating composition and accelerates the self-assembly speed.

The second coating composition is then cured to a cured second coating.

In another aspect, fabrication of the lenticular print three dimensional image display device can be completed in a single pass-process. All of the printing steps and curing steps can be set-up in a series to allow for a single pass process. In one process, the image is be printed on the proximate surface of a substrate; a first curable coating composition is applied directly on the printed image in a first pre-determined pattern; the first curable coating composition is cured; a second curable coating composition is applied on the printed image wherein the second curable coating composition self-registers into a second pattern that does not overlap with the first pre-determined pattern; and the second curable coating composition is cured to form the device.

Application methods such as, but not limited to, offset printing, gravure printing, ink jet printing, lithography printing, flexographic printing, silk-screen printing and air brushing can be retro-fitted to perform a single pass-process to form the display device. Also, a combination of the above noted printing methods can be joined together to conduct the single pass-process. The single pass-process allows selective spot printing (rather than printing to the entire area) of the substrate. With this selectivity, the displays can be prepared in various angles to the substrate, and thus no longer limited to a perpendicular pattern to the substrate.

Depending upon the choice of printer/applicator/coater, the viscosity of the second curable coating composition can be modified to suit the printing/application/coating process. In one embodiment, the second curable coating composition is applied with a flexographic coater in a flexographic (flexo) press. In another embodiment, the second curable coating composition is applied with a flexographic coater at the end of a lithographic press, where the first coating is printed by means of lithographic printing. Yet in another embodiment, both coating compositions can be applied by means of ink jet printing process. Methodologies that allows for high volume is desirable for forming the lenticular lens. In one embodiment, this can be accomplished by a high volume anilox with cell volume of about 50 to about 110 bcm/in$^2$. This amount of coating can be adjusted by techniques described in "High volume, texture liquid transfer surface" (U.S. Pat. No. 5,908,505) and "Direct printing device" (US2008/0302262). The thickness of each coating can be adjusted by means of viscosity and application method to achieve second cured coating of at least two times, preferably three times, more preferably four times higher than the height of the first cured coating.

The aforementioned processes do not require the use of a transparent plastic substrate to be transposed between the image and the lenticular lenses. Without the need for the transparent plastic substrate, the device is more flexible and lighter. Images can be printed on paper substrates, including high gloss paper such as magazine covers. Paper substrates with the device can also be recyclable without the additional cost and energy of separating out the plastic substrate. Cost of the device and the method significantly decreases due to higher throughput and selective application on substrates.

EXAMPLES

Example 1—First Curable Coating Composition for Litho Application

The components of first curable coating are shown in Table 1. This UV-curable coating was prepared by mixing the first seven components at about 60° C. on a hot plate to dissolve the solid components with a saw-tooth mixing blade in a stainless steel container. After the solids were completely dissolved, monomer and defoamer were added to the container and mixed until uniform. The remaining components were then added and mixed until uniform. The viscosity of the coating was about 2050 mPa·sec (measured using Brookfield Viscometer, model LV using #3 spindle, 30 rpm at 50° C.). The coating was applied with Little Joe Ink Proofer to simulate lithographic ink station.

TABLE 1

First Coating-Litho Version

| Component | | wt % |
|---|---|---|
| Acrylate oligomer #1 | Ebecryl 3720TM20 (80% Bisphenol-A-epoxy diacrylate oligomer diluted in 20% Trimethylolpropane triacrylate monomer) (Cytec) | 69.50 |

TABLE 1-continued

First Coating-Litho Version

| Component | | wt % |
|---|---|---|
| Acrylate oligomer #2 | CN9167US (Sartomer) | 10.05 |
| Photoinitiator #1 | 1-hydroxy-cyclohexylphenyl ketone (BASF/Ciba)) | 6.00 |
| Photoinitiator #2 | Benzil dimethyl ketal (BASF/Ciba) | 1.50 |
| Stabilizer | Hydroquinone monomethyl ether (Rhodia) | 0.15 |
| Additive—optical brightener | Unitex OB (BASF/Ciba) | 0.10 |
| Cure accelerator | ethyl-4-(dimethylamino)benzoate (IGM Resin) | 1.00 |
| Acrylate monomer | Propoxylated glyceryl triacrylate (Sartomer) | 4.13 |
| Additive—defoamer | Foamblast 20F (Emerald Performance Materials) | 0.07 |
| Additive—filler | Aerosil R972 (Evonik/Degussa) | 0.50 |
| Acrylated poly-organosiloxane | Silcolease PC 900 (Blue Star Silicones) Mw = 26,030 Daltons | 5.00 |
| Additive—flow control | Paint additive DC57 (Dow Corning) Mw = 12,290 Daltons | 2.00 |
| Total | | 100.00 |

Example 2—First Curable Coating Composition for Flexo Application

Another example of first coating is shown in Table 2. This example is directed to flexo coater application. This coating was prepared by mixing the first six components at about 40° C. on a hot plate to dissolve the solid components with a saw-tooth mixing blade in stainless steel container. After the solids were dissolved, the mixture was cooled and the remaining components were then added and mixed until uniform. The viscosity of the coating was about 220 mPa·sec (measured using Brookfield Viscometer, model LV using #4 spindle, 60 rpm at 25° C.). The coating was applied with lab flexo hand proofer unit (from Cavanagh Corporation) to simulate a flexo coater.

TABLE 2

First Coating—Flexo Version

| Component | | wt % |
|---|---|---|
| Acrylate monomer | Trimethylolpropane triacrylate (Sartomer) | 45.00 |
| Acrylate Oligomer | Ebecryl 3720TM20 (80% Bisphenol-A-epoxy diacrylate oligomer diluted in 20% Trimethylolpropane triacrylate monomer) (Cytec) | 20.30 |
| Acrylate monomer | Tripropylene glycol diacrylate (Sartomer) | 4.00 |
| Photoinitiator #1 | 2-hydroxyl-2 methyl-1-phenylpropa-none (IGM Resin) | 1.00 |
| Photoinitiator #2 | Benzophenone (IGM Resin) | 15.00 |
| Additive—Optical brightener | Unitex OB (BASF/Ciba) | 0.07 |
| Additive—flow additive | Paint additive DC57 (Dow Corning) | 1.60 |
| Cure accelerator | 2-Propenoic acid, 2-ethyl-2-(((1-oxo-2-propenyl)oxy)methyl)-1,3-propanediyl ester (Henkel) | 2.00 |
| | Triethanol amine (non-crosslinkable) (Ashland) | 6.00 |
| Additive—defoamer | Suppressor 2131 (Hydrite Chemical Co.) | 0.03 |
| Acrylated poly-siloxane | Silcolease PC PC 970 (Blue Star Silicones) Mw = 55,660 Daltons | 5.00 |
| Total | | 100.00 |

Example 3. Second Coating Composition with Self-Assembly Additive

An example of the second coating with self assembly additive that accelerates the speed of self registering is listed in Table 3. This coating was prepared by mixing the first eight components at about 40° C. on a hot plate to dissolve the solid components with a saw-tooth mixing blade in stainless steel container. After the solids were dissolved, the mixture was cooled and the remaining components were then added until the mixture was uniform. The viscosity of the coating was about 150-200 mPa·sec (measured using Brookfield Viscometer, model LV using #3 spindle, 30 rpm at 25° C.). The coating was applied with flexo hand proofer unit (from Canavagh Corporation) to simulate a flexo coater.

TABLE 3

Second coating with self assembly additive

| | Component | wt % |
|---|---|---|
| Acrylate monomer | Trimethylolpropane triacrylate (TMPTA) monomer (Sartomer) | 26.57 |
| Acrylate monomer | 2(2-ethoxyethoxy)ethyl acrylate (Sartomer) | 10.00 |
| Acrylate monomer | Tripropylene glycol diacrylate (Sartomer) | 4.92 |
| Acrylate Oligomer | Ebecryl 3720 TM40 (Cytec) | 38.13 |
| Additive—Optical brightener | Unitex OB (BASF/Ciba) | 0.10 |
| Photoinitiator #1 | 2-hydroxyl-2 methyl-1-phenylpropanone (photoinitiator) (BASF/Ciba) | 4.00 |
| Photoinitiator #2 | 1-hydroxy-cyclohexylphenyl ketone (BASF/Ciba) | 2.50 |
| Photoinitiator #3 | Lucirin TPO-L (BASF/Ciba) | 1.50 |
| Cure accelerator | Copolymerizable amine synergist (2-Propenoic acid, 2-ethyl-2-(((1-oxo-2-propenyl)oxy)methyl)-1,3-propanediyl ester (CAS#68002-34-6) (Henkel, 9086M) | 8.15 |
| Cure accelerator | Triethanolamine 99% (Ashland) | 3.63 |
| Self-assembly additive | Basilcone Paint Additive 3451 (OMG group), Mw = 417,950 Daltons | 0.50 |
| | Total | 100 |

Comparative Example A—Second Curable Coating with Mw Less than 200,000 Daltons for Flexo Application A comparative example of a second coating is shown in Table 4. This example is directed to flexo coater application. This coating was prepared by mixing the first eight components at about 40° C. on a hot plate to dissolve the solid components with a saw-tooth mixing blade in stainless steel container. After the solids were dissolved, the mixture was cooled and the remaining ingredients were then added and mixed until uniform. The viscosity of the coating was about 200-270 mPa·sec (measured using Brookfield Viscometer, model LV using #3 spindle, 30 rpm at 25° C.).

TABLE 4

Second Coating with self-assembly additive that has a Mw less than 100,000 Daltons (Comparative A)

| | Component | wt % |
|---|---|---|
| Acrylate monomer | Trimethylolpropane triacrylate (TMPTA) monomer (Sartomer) | 19.85 |
| Acrylate oligomer | Ebecryl 3720 TM40 (Cytec) | 37.00 |
| Acrylate monomer | 2(2-ethoxyethoxy)ethyl acrylate (Sartomer) | 10.00 |

TABLE 4-continued

Second Coating with self-assembly additive that has a Mw less than 100,000 Daltons (Comparative A)

| | Component | wt % |
|---|---|---|
| Acrylate monomer | Tripropylene glycol diacrylate | 4.92 |
| Additive—Optical brightener | Unitex OB (BASF/Ciba) | 0.10 |
| Photoinitiator #1 | 2-hydroxyl-2 methyl-1-phenylpropanone (photoinitiator) (BASF/Ciba) | 4.00 |
| Photoinitiator #2 | 1-hydroxy-cyclohexylphenyl ketone (BASF/Ciba) | 2.50 |
| Photoinitiator #3 | Benzil dimethyl ketal (BASF/Ciba) | 1.50 |
| Cure accelerator | copolymerizable amine synergist (2-Propenoic acid, 2-ethyl-2-(((1-oxo-2-propenyl)oxy)methyl)-1,3-propanediyl ester (CAS#68002-34-6) (Henkel, 9086M) | 8.15 |
| Cure accelerator | Triethanolamine 99% (Ashland) | 3.63 |
| Acrylate monomer | EB4849 (Cytec) | 5.00 |
| Acrylate monomer | Trimethylolpropane triacrylate (TMPTA) monomer (Sartomer) | 0.90 |
| Wax additive | Lo Angle 5413 (Shamrock Technologies) | 0.45 |
| Self assembly additive | Paint additive DC57 (additive: flow from Dow Corning) Mw = 12,290 Daltons | 2.00 |
| | Total | 100.00 |

Comparative Example B—Second Curable Coating without the Self-Assembly Additive for Flexo Application A comparative example a second coating is shown in Table 5. This example is directed to flexo coater application. This coating was prepared by mixing the first ten components at about 40° C. on a hot plate to dissolve the solid components with a saw-tooth mixing blade in stainless steel container. After the solids were dissolved, the mixture was cooled and the remaining components were then added and mixed until the mixture was uniform. The viscosity of the coating was about 900-1,200 mPa·sec (measured using Brookfield Viscometer, model LV using #3 spindle, 30 rpm at 25° C.). The coating was applied with flexo hand proofer unit (from Cavanagh Corporation) to simulate a flexo coater.

TABLE 5

Second coating without any self-assembly additive (Comparative B)

| | Component | Wt % |
|---|---|---|
| Acrylate monomer | Tripropylene glycol diacrylate (Sartomer) | 19.00 |
| Acrylate Oligomer | Ebecryl 3720TM20 (80% Bisphenol-A-epoxy diacrylate oligomer diluted in 20% Trimethylopropane triacrylate monomer) (Cytec) | 6.50 |
| Acrylate Oligomer | Ebecryl 3720TP40 (60% Bisphenol-A-epoxy diacrylate oligomer diluted in 40% Tripropylene glycol diacrylate monomer) (Cytec) | 40.10 |
| Acrylate Oligomer | Ebecryl 4827 (Cytec) | 6.00 |
| Acrylate Oligomer | CN704 (Sartomer) | 18.00 |
| Photoinitiator #1 | 1-hydroxy-cyclohexylphenyl ketone (BASF/Ciba) | 3.50 |
| Photoinitiator #2 | Benzil dimethyl ketal (BASF/Ciba) | 1.40 |
| Photoinitiator #3 | Lucirin TPO-L (BASF) | 0.25 |
| Additive—stabilizer | Hydroquinone monomethyl ether (Rhodia) | 0.10 |
| Additive—Optical brightener | Unitex OB (BASF/Ciba) | 0.15 |
| Cure accelerator | Methyldiethanolamine (non-crosslinkable) (Ashland) | 5.00 |
| | Total | 100.00 |

Example 4—Applications

First coating, Table 1, was with applied with Little Joe Ink Proofer (1.5 gm) and using rubber roller to transfer the coating onto a photopolymer plate with a 60 LPI (lines per inch) fine line pattern, then this interlace line pattern was printed on C1S paperboard to create the first pre-determined pattern as shown in 300 in FIG. 2. It was then cured with Lab UV curing unit, Fusion F300S, at 100 mJ/cm$^2$ as measured by UVICURE Plus II radiometer. The second coating, Table 3, was applied with Cavanagh Corporation flexo hand proofer with 53 bcm anilox on top of the cured first coating area as flood coat. The second curable coating composition self-registered into a second pattern that did not overlap with the first pre-determined pattern as shown in 400 in FIG. 2. The self-assembly speed was instantaneous. The second coating was then cured with Lab UV curing unit, Fusion F300S, at 100 mJ/cm$^2$ as measured by UVICURE Plus II radiometer. The example created the overall pattern as demonstrated in FIG. 2.

Example 5—Application (Comparative A)

First coating, Table 2, was with applied with Cavanagh Corporation flexo hand proofer with 12 bcm anilox roller onto a photopolymer plate with a 30 LPI fine line pattern, then this interlace line pattern was printed on C1S paperboard to create the first pre-determined pattern as shown in 300 in FIG. 2. It was then cured with Lab UV curing unit, Fusion F300S, at 100 mJ/cm$^2$ as measured by UVICURE Plus II radiometer. Table 4 was used as the second coating and was applied with Cavanagh Corporation flexo hand proofer with 53 bcm anilox on top of the cured first coating area as flood coat. The second coating covered up the line pattern (first pre-determined pattern) and formed a uniform layer that did not self-register into a second pattern. The second coating was then cured with Lab UV curing unit, Fusion F300S, at 100 mJ/cm$^2$ as measured by UVICURE Plus II radiometer. The combination of these two coating did not results in a self-registered pattern.

Example 6—Application (Comparative B)

First coating, Table 1, was with applied with Little Joe Ink Proofer (Little Joe Corporation, 1.5 gm) and using rubber roller to transfer the coating onto a photopolymer plate with a 60 LPI (lines per inch) fine line pattern, then this interlace line pattern was printed on C1S paperboard to create the first pre-determined pattern as shown in 300 in FIG. 2. It was then cured with Lab UV curing unit, Fusion F300S, at 100 mJ/cm$^2$ as measured by UVICURE Plus II radiometer. The second coating, Table 5, was applied with Cavanagh Corporation flexo hand proofer with 53 bcm anilox on top of the cured first coating area as flood coat. The second curable coating composition self-assembled into uniform lenticular lens that did not overlap with the first pre-determined pattern as shown in 400 in FIG. 2. The self-assembly speed ranged in the speed of 5-10 seconds. The second coating was then cured with Lab UV curing unit, Fusion F300S, at 100 mJ/cm$^2$ as measured by UVICURE Plus II radiometer. The example created the overall pattern as shown in FIG. 2. If Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

I claim:

1. A lenticular print three dimensional image display device comprising:
   (A) a substrate with a proximate surface and a distal surface wherein an interlaced image is printed on either surface of the substrate;
   (B) a first cured coating composition that comprises in an uncured state (i) at least one acrylate monomer, (ii) an acrylate oligomer with a backbone that comprises one or more groups selected from epoxy, polyester, urethane, acrylic and silicone, (iii) a photoinitiator, and (iv) a siloxane or silicone additive applied directly on the proximate surface of the substrate in a first pre-determined pattern; and
   (C) a second cured coating composition that comprises in an uncured state (i) at least one acrylate monomer, (ii) an acrylate oligomer with a backbone that comprises one or more groups selected from epoxy, polyester, urethane, acrylic and silicone, (iii) a photoinitiator, and (iv) a self-assembly additive applied in the uncured state upon on the proximate surface of the substrate and first coating, and wherein the second curable coating composition is a self-registering composition self-registered into a second pattern that does not overlap with the first pre-determined pattern; and
wherein the siloxane or silicone additive has a weight average molecular weight (Mw) less than 100,000 Daltons and the self-assembling additive has a weight average molecular weight (Mw) greater than 200,000 Daltons.

2. The lenticular print three dimension image display device of claim 1 wherein the interlaced image is printed on the proximate surface of the substrate.

3. The lenticular print three dimensional image display device of claim 1 wherein the substrate is paper or plastic film.

4. The lenticular print three dimensional image display device of claim 3 wherein the paper is a clay-coated paper or a primer-sealed paper.

5. The lenticular print three dimensional image display device of claim 3 wherein the plastic film is an oriented polypropylene, polystyrene, polyvinylchloride, polycarbonate, polyethylene, polyethylene terephthalate or acrylic.

6. The lenticular print three dimensional image display device of claim 1 wherein the acrylate monomer is selected from the group consisting of mono-functional acrylate monomers, di-functional acrylate monomers, tri-functional acrylate monomers, multi-functional acrylate monomers and mixtures thereof.

7. The lenticular print three dimensional image display device of claim 1 wherein the acrylate oligomer is selected from the group consisting of epoxy acrylate oligomer, polyester acrylate oligomer, urethane acrylate oligomer, acrylic acrylate oligomer, silicone acrylate oligomer and mixtures thereof.

8. The lenticular print three dimensional image display device of claim 1 wherein the siloxane or silicone additive has a weight average molecular weight (Mw) less than 75,000 Daltons.

9. The lenticular print three dimensional image display device of claim 1 wherein the siloxane or silicone additive is selected from the group consisting of radically crosslinkable silicone polyether acrylate, radically crosslinkable silicone acrylate, polyether siloxane copolymer, acrylated polysiloxanes, organa modified silicone polymer, polyalkyleneoxide modified polydimethylsiloxane, polydimethylsiloxanes, nonreactive silicone glycol copolymer surfactant, polyether modified polydimethylsiloxane, acrylated polyorganosiloxanes and mixtures thereof.

10. The lenticular print three dimensional image display device of claim 1 wherein the second coating has an uncured viscosity from about 150 to about 10,000 mPa·sec at 25° C.

11. The lenticular print three dimensional image display device of claim 1 wherein the self-assembly additive has a weight average molecular weight greater than 300,000 Daltons.

12. The lenticular print three dimensional image display device of claim 1 wherein the self-assembly additive is selected from the group consisting of polydimethylsiloxane, methyl polysiloxane, and mixtures thereof.

13. The lenticular print three dimensional image display device of claim 1 further comprising a cure accelerator.

14. The lenticular print three dimensional image display device of claim 13 wherein the cure accelerator is selected from the group consisting of methyl diethanolamine, triethanolamine, n-butyldiethanolamine, ethyl-4-(dimethylamino) benzoate, 2-ethylhexyl-4-(dimethylamino)benzoate, 2-(dimethylamino)ethyl benzoate, poly[oxy(methyl-1,2-ethyanediyl)], alpha-[4-(dimethylamino)benzoyl-butoxy, poly[oxy(methyl 1,2-ethanediyl)], alpha-[4-(dimethylamino)benzoyl-alpha-butoxy, butoxyethyl-4-(dimethylamino)benzoate, 2-propenoic acid, 2-ethyl-2-(((1-oxo-2-propenyl)oxy)methyl)-1,3-propanediyl ester and mixtures thereof.

15. A method of fabricating a print three dimensional image display device comprising:
   (i) printing an interlaced image on the proximate surface of a substrate;
   (ii) applying a first curable coating composition directly on top of the interlaced image in a first pre-determined pattern;
   (iii) curing the first curable coating composition;
   (iv) applying a second curable coating composition directly on top of the interlaced image and first curable coating composition and allowing the second curable coating composition to self-registers into a second pattern that does not overlap with the first pre-determined pattern; and
   (v) curing the second curable coating composition;
   wherein the first curable coating composition comprises a siloxane or silicone additive with a weight average molecular weight (Mw) less than 100,000 Daltons and the second curable coating composition comprises a self-assembling additive with a weight average molecular weight (Mw) greater than 200,000 Daltons.

16. The method of fabricating a print three dimensional image display device of claim 15 wherein an air is blown on the proximate surface of the substrate after step (iv) and before step (v).

17. The method of fabricating a print three dimensional image display device of claim 16 wherein the air blown on the proximate surface is heated air.

18. The method of fabricating a print three dimensional image display device of claim 15 wherein the substrate is a paper or a plastic film.

19. The method of fabricating a print three dimensional image display device of claim 15 wherein the first curable coating composition is applied to the proximate surface in a plurality of lines, semicircular domes or rectangular domes.

20. The method of fabricating a print three dimensional image display device of claim 15 wherein the curing of the first curable coating composition is performed with ultraviolet radiation.

21. The method of fabricating a print three dimensional image display device of claim 15 wherein the method is a single-pass process comprising:
   (i) flexographic printing an interlaced image onto a proximate surface of a substrate;
   (ii) flexographic printing a first curable coating composition onto the proximate surface of the substrate;
   (iii) curing the first curable coating composition;
   (iv) flexographic printing a second curable coating composition onto the proximate surface of the substrate; and
   (v) curing the second curable coating composition.

22. The method of fabricating a print three dimensional image display device of claim 15 wherein the method is a single-pass process comprising:
   (i) lithography printing an interlaced image onto a proximate surface of a substrate;
   (ii) lithography printing a first curable coating composition onto the proximate surface of the substrate;
   (iii) curing the first curable coating composition;
   (iv) flexographic printing a second curable coating composition onto the proximate surface of the substrate; and
   (v) curing the second curable coating composition.

23. The method of fabricating a print three dimensional image display device of claim 15 wherein the method is a single-pass process comprising:
   (i) ink jet printing an interlaced image onto a proximate surface of a substrate;
   (ii) flexographic printing a first curable coating composition onto the proximate surface of the substrate;
   (iii) curing the first curable coating composition;
   (iv) flexographic printing a second curable coating composition onto the proximate surface of the substrate; and
   (v) curing the second curable coating composition.

24. A method of fabricating a print three dimensional image display device comprising:
   (i) printing an interlaced image on the proximate surface of a substrate;
   (ii) applying a first curable coating composition directly upon the interlaced image in a first pre-determined pattern;
   (iii) applying a second curable coating composition directly upon the interlaced image and first curable coating and allowing the second curable coating to self-register such that it forms a second pre-determined pattern that does not overlap with the first pre-determined pattern; and
   (iv) curing the first and the second curable coating compositions simultaneously; wherein the first curable coating composition comprises a siloxane or silicone additive with a weight average molecular weight (Mw) less than 100,000 Daltons and the second curable coating composition comprises a self-assembling additive with a weight average molecular weight (Mw) greater than 200,000 Daltons.

25. A formulation for forming a lenticular print three dimensional image display device in association with a substrate with a proximate surface and a distal surface wherein an interlaced image is printed on either surface of the substrate, the formulation comprising:
   a first curable coating composition that comprises (i) at least one acrylate monomer, (ii) an acrylate oligomer with a backbone that comprises one or more groups selected from epoxy, polyester, urethane, acrylic and silicone, (iii) a photoinitiator, and (iv) a siloxane or silicone additive, the first curable coating composition for application directly upon the proximate surface of the substrate in a first pre-determined pattern; and a second curable coating composition that comprises (i) at least one acrylate monomer, (ii) an acrylate oligomer with a backbone that comprises one or more groups selected from epoxy, polyester, urethane, acrylic and silicone, (iii) a photoinitiator, and (iv) a self-assembly additive, the second curable coating composition for application directly upon the on exposed proximate surface of the substrate and the applied first curable coating, the second curable coating composition being a self-registering composition for self-registration into a second pattern that does not overlap with the first pre-determined pattern;

wherein the siloxane or silicone additive has a weight average molecular weight (Mw) less than 100,000 Daltons and the self-assembling additive has a weight average molecular weight (Mw) greater than 200,000 Daltons.

* * * * *